(12) United States Patent
Jong et al.

(10) Patent No.: US 6,324,092 B1
(45) Date of Patent: Nov. 27, 2001

(54) RANDOM ACCESS MEMORY CELL

(75) Inventors: Fuh-cheng Jong, Tainan; Ming-Hung chou, Miaoli Hsien; Kent Kuohua Chang, Tu-Cheng, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/781,770

(22) Filed: Feb. 12, 2001

(30) Foreign Application Priority Data

Jan. 3, 2001 (TW) .................................................. 90100098

(51) Int. Cl.$^7$ ....................................................... G11C 7/00
(52) U.S. Cl. .......................... 365/154; 365/174; 365/177; 365/182; 365/185; 365/185.15; 365/185.24; 365/185.26; 365/185.05
(58) Field of Search ..................................... 365/154, 174, 365/177, 182, 185, 185.18, 185.24, 185.05, 185.26

(56) References Cited

U.S. PATENT DOCUMENTS

| | | | |
|---|---|---|---|
| 5,757,700 | * | 5/1998 | Kobayashi ..................... 365/189.01 |
| 5,867,443 | * | 2/1999 | Linderman ........................... 365/228 |
| 6,075,738 | * | 6/2000 | Takano ................................. 365/210 |
| 6,094,368 | * | 7/2000 | Ching ..................................... 365/49 |
| 6,198,652 | * | 3/2001 | Kawakeibo et al. ................. 365/145 |
| 6,198,682 | * | 3/2001 | Proebsting ........................... 365/207 |
| 6,240,032 | * | 5/2001 | Fukumoto ............................ 365/222 |

* cited by examiner

Primary Examiner—Viet Q. Nguyen
(74) Attorney, Agent, or Firm—Jiawei Huang; J.C. Patents

(57) ABSTRACT

A random access memory cell. The RAM cell includes a first transistor and a second transistor. A control gate of the first transistor is coupled to a control signal line. A data read terminal of the first transistor is coupled to a data read line. An earth terminal of the first transistor is connected to a ground. A floating gate terminal of the first transistor is located between a portion of a substrate and a portion of the control gate. A control gate of the second transistor is also coupled to the control signal line. The data write terminal of the second transistor is a data write line. A data transmission terminal of the second transistor is coupled to the floating gate of the first transistor. To write data into the RAM cell, a write control voltage is applied to the control signal line. Similarly, to read data from the RAM cell, a read control voltage is applied to the control signal line. The write control voltage is greater than the read control voltage.

7 Claims, 2 Drawing Sheets

RANDOM ACCESS MEMORY CELL

CROSS-REFERENCE TO RELATED APPLICATION

This application claims the priority benefit of Taiwan application serial no. 90100098, filed Jan. 3, 2001.

BACKGROUND OF THE INVENTION

1. Field of Invention

The present invention relates to a type of memory cell. More particularly, the present invention relates to a random access memory cell.

2. Description of Related Art

In general, random access memory (RAM) can be categorized into two major types: dynamic random access memory (DRAM) and static random access memory (SRAM). Because the process of reading data from a DRAM cell is a destructive operation, meaning that data originally held inside the memory cell is destroyed after the reading, constant refreshing of memory cell data is required. In addition, since the DRAM cell uses a capacitor to store up the charges for representing data, the capacitor should be sufficiently large to prevent data loss. In reality, each memory cell should be made as small as possible in order to cram more devices within a chip. The reduction of each memory cell and hence the capacitor inside the cell means that only a very small voltage and current can be provided. However, the provision of a small voltage or current renders the probing of any voltage or current changes difficult. Ultimately, operating speed of the memory cell is reduced.

On the other hand, the process of reading data from a SRAM cell is non-destructive. There is no need to perform frequent data-refreshing operations. However, each SRAM cell consists of a minimum of four MOS transistors. Therefore, each SRAM cell occupies a volume much greater than a DRAM cell.

In brief, a conventional memory cell has at least the following drawbacks, including:

1. For DRAM, frequent refresh of memory DRAM cell data is required because the data inside the cell is destroyed after each reading operation.

2. Since a capacitor is used to store data charges in DRAM but only a small capacitor can be produced due to miniaturization, very small voltage or current can be provided.

3. A SRAM cell consists of at least four MOS transistors. Hence, each SRAM cell needs to occupy a much larger volume than a DRAM cell.

SUMMARY OF THE INVENTION

Accordingly, one object of the present invention is to provide a random access memory cell having a unit cell volume much smaller than a static random access memory (SRAM) cell and employing a non-destructive reading process. Moreover, the RAM cell provides a reading current much greater than a conventional dynamic random access memory (DRAM) cell so that a higher operating speed can be attained.

To achieve these and other advantages and in accordance with the purpose of the invention, as embodied and broadly described herein, the invention provides a random access memory (RAM) cell. The RAM cell includes a first transistor and a second transistor. A control gate of the first transistor is coupled to a control signal line. A data read terminal of the first transistor is coupled to a data read line. An earth terminal of the first transistor is connected to a ground. A floating gate terminal of the first transistor is located between a portion of a substrate and a portion of the control gate. A control gate of the second transistor is also coupled to the control signal line. The data write terminal of the second transistor is a data write line. A data transmission terminal of the second transistor is coupled to the floating gate of the first transistor. To write data into the RAM cell, a write control voltage is applied to the control signal line. Similarly, to read data from the RAM cell, a read control voltage is applied to the control signal line. The write control voltage is greater than the read control voltage.

In summary, this invention utilizes a floating gate to store data charges. Since the stored data are not destroyed after each data reading operation, frequent data refreshing is not required. In addition, this invention uses only 2.5 conventional transistors. Hence, each RAM cell occupies a volume much smaller than a SRAM cell.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
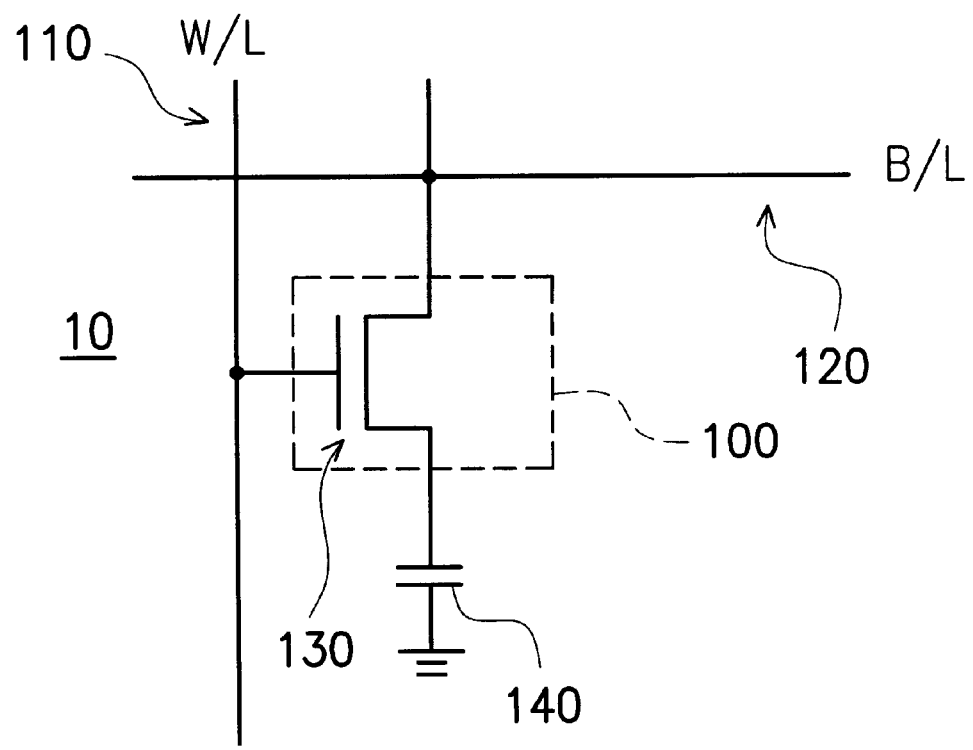
FIG. 1 is an equivalent circuit diagram of a conventional dynamic random access memory cell.

Reference will now be made in detail to the present preferred embodiments of the invention, examples of which are illustrated in the accompanying drawings. Wherever possible, the same reference numbers are used in the drawings and the description to refer to the same or like parts.

In order to explain the differences in operation between the random access memory (RAM) of this invention and some other conventional RAM cells, the operations of some conventional RAM cells are first described in detail below.

FIG. 1 is an equivalent circuit diagram of a conventional dynamic random access memory cell. As shown in FIG. 1, each DRAM cell 10 includes a transistor 100, a capacitor 140, a word line 110 and a bit line 120. The word line 110 and the bit line 120 serve as a control line or data line, choosing to write data into the memory cell or read from the memory cell. To write data into the DRAM cell 10, a high potential is applied to the word line 110. The transistor 100 is conductive because of the high potential at the gate terminal 130. Voltage on the bit line 120, no matter if a high potential representing a logic '1' or a low potential representing a logic '0', will be transferred to the capacitor 140 via the transistor 100. Similarly, to read data from the DRAM cell 10, a high potential is applied to the word line 110. Hence, the transistor 100 is conductive. Any stored electric charges in the capacitor 140 will release to the bit line 120, thereby forming a current.

When data is read from a DRAM cell, the original stored charges inside the capacitor 140 will be released leading to the cancellation of the data within the memory cell 10. Hence, besides the need to compensate for any charge leakage from the capacitor by refreshing, the original data inside the memory cell 10 must also be reinstated by charging up the capacitor correctly after each reading step. In addition to frequent refreshing, size reduction of memory cell also lowers the amount of charge capable of being stored by the capacitor. Consequently, only a weak current can be produced on the bit line. Since strength of the current on the bit line directly affects the correct sensing of memory data, operating speed of the memory cell is reduced correspondingly.

Figure 2:
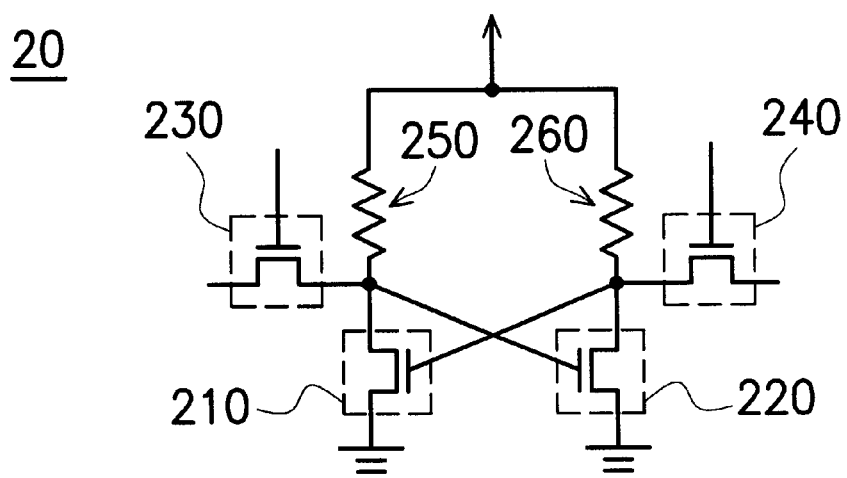
FIG. 2 is an equivalent circuit diagram of a conventional static random access memory cell.

FIG. 2 is an equivalent circuit diagram of a conventional static random access memory cell. As shown in FIG. 2, the static random access memory (SRAM) cell 20 has altogether four transistors 210, 220, 230, 240 and a pair of resistors 250 and 260. Although the operation speed of the SRAM cell 20 is fast and requires no data refreshing operation, the cost for fabricating four transistors in each cell is high.

Figure 3:
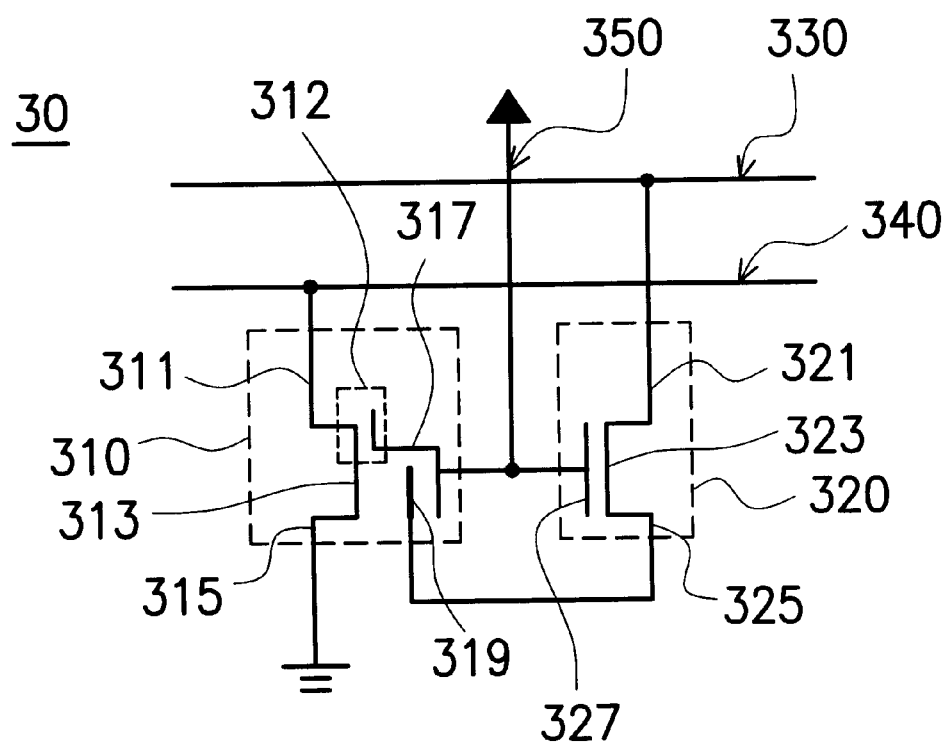
FIG. 3 is an equivalent circuit diagram of a random access memory cell according to one preferred embodiment of this invention.

FIG. 3 is an equivalent circuit diagram of a random access memory cell according to one preferred embodiment of this invention. In this embodiment, the memory cell 30 has two transistors 310 and 320 for controlling a data write line 330 and a data read line 340 and providing a control line 350 for a read/write control voltage. The control line 350 can be the word line of a DRAM cell. In addition, both the transistor 310 and the transistor 320 have a threshold voltage. The transistors 310 and 320 start to conduct only when a voltage greater than the threshold is applied. In addition, the transistor 310 has a threshold voltage smaller than the transistor 320.

To write data into the memory cell 30, a data voltage is applied to the data write line 330. Since a write control voltage is applied to the control line 350 to switch on the transistor 320, the write control voltage must be greater than the threshold voltage of the transistor 320. As the control voltage provided by the control line 350 is applied to the control gate 327 of the transistor 320, the transistor 320 starts to conduct. Voltage at the data write line 330 is led from the data write terminal 321 via the substrate 323 and the data transmission terminal 325 to the floating gate 319 of the transistor 310. The data write terminal 321 may be the source terminal or the drain terminal of a metaloxide-semiconductor (MOS) transistor while the data transmission terminal 325 may be the corresponding drain terminal or the source terminal of the MOS transistor. Note that although a MOS transistor is chosen in the illustration, other types of transistors may be deployed. At the completion of a data write operation, the control line 350 stops providing a write control voltage. Hence, the written data (voltage) is stored as charges inside the floating gate 319.

To read data from the memory cell 30, a read control voltage is applied via the control line 350. The read control voltage must have a value smaller than the threshold voltage of the transistor 320. In addition, the read control voltage must be comparable to the threshold voltage of the transistor 310. In other words, the read control voltage should be able to turn the transistor 310 on without turning the transistor 320 on so that the stored data charges inside the floating gate 319 cannot leak out from the transistor 320. However, the read control voltage applied to the control gate 317 of the transistor 310 is able to switch on the portion 312 between the control gate 317 and the substrate 313 where the floating gate 319 is absent. Hence, the switching of the transistor 310 depends on the voltage applied to the floating gate 319. When voltage at the floating gate 319 is lower than the threshold voltage of the transistor 310, the transistor 310 is non-conductive. Therefore, no current flows on the data read line 340. In contrast, when voltage at the floating gate 319 is higher than the threshold voltage of the transistor 310, the transistor 310 is conductive. The voltage between the data read terminal 311 and the earth terminal 315 leads to a current flowing through the transistor 310. Ultimately, a current is produced in the data read line 340.

Due to the electrical characteristics of a MOS transistor, a voltage much greater than the one provided by the capacitor inside a conventional DRAM cell is provided between the source terminal and the drain terminal of the MOS transistor. In other words, a current much greater than the current produced by a conventional DRAM cell is produced in the data read line 340.

In this embodiment, only 2.5 transistors (transistors 310, 320 and the floating gate 319) are used. Thus, the cost of production and volume of occupation of each memory cell is much lower than a SRAM cell.

In conclusion, the memory cell of this invention is able to provide some advantages over conventional DRAM and SRAM. Reading data from the memory cell is non-destructive and the cell is able to provide a much larger reading current for faster operation. In addition, only 2.5 transistors are needed to form each memory cell so that the RAM cell occupies less area than a SRAM cell.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A random access memory cell, comprising:

a first transistor having a first control gate, a floating gate, a first substrate, a data read terminal and an earth terminal, wherein the first transistor is switched on when a voltage greater than a first threshold voltage is applied, the first control gate is connected to a control signal line, the data read terminal is connected to a data read line, the earth terminal is connected to a ground, the floating gate is located between a portion of the first substrate and a portion of the first control gate; and a second transistor having a second control gate, a second substrate, a data write terminal and a data transmission terminal, wherein the second transistor is switched on when a voltage greater than a second threshold voltage is applied, the second control gate is connected to the control signal line, the data write terminal is connected to a data write line and the data transmission terminal is connected to the floating gate;

wherein the second threshold voltage is greater than the first threshold voltage, the control signal line needs to provide a write control voltage to write data into the memory cell and a read control voltage to read data out of the memory cell, the write control voltage is greater than or equal to the second threshold voltage while the read control voltage is smaller than the second threshold voltage but greater than or equal to the first threshold voltage.

2. The memory cell of claim 1, wherein the first transistor includes a metaloxide-semiconductor transistor.

3. The memory cell of claim 2, wherein the data read terminal is the source terminal of the metal-oxide-semiconductor transistor and the earth terminal is the drain terminal of the metal-oxide-semiconductor transistor.

4. The memory cell of claim 2, wherein the data read terminal is the drain terminal of the metal-oxide-semiconductor transistor and the earth terminal is the source terminal of the metal-oxide-semiconductor transistor.

5. The memory cell of claim 1, wherein the second transistor includes a metaloxide-semiconductor transistor.

6. The memory cell of claim 5, wherein the data write terminal is the drain terminal of the metal-oxide-semiconductor transistor and the data transmission terminal is the source terminal of the metal-oxide-semiconductor transistor.

7. The memory cell of claim 5, wherein the data write terminal is the source terminal of the metal-oxide-semiconductor transistor and the data transmission terminal is the drain terminal of the metal-oxide-semiconductor transistor.

* * * * *